United States Patent
Nakagawa et al.

(10) Patent No.: US 8,917,897 B2
(45) Date of Patent: Dec. 23, 2014

(54) MICROPHONE

(75) Inventors: Yusuke Nakagawa, Kyoto (JP);
Yasuhiro Horimoto, Kusatsu (JP);
Tadashi Inoue, Yasu (JP); Toshiyuki Takahashi, Otsu (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 13/318,248

(22) PCT Filed: Mar. 16, 2011

(86) PCT No.: PCT/JP2011/056253
§ 371 (c)(1),
(2), (4) Date: Feb. 15, 2012

(87) PCT Pub. No.: WO2012/114536
PCT Pub. Date: Aug. 30, 2012

(65) Prior Publication Data
US 2013/0343590 A1   Dec. 26, 2013

(30) Foreign Application Priority Data
Feb. 21, 2011   (JP) .................. 2011-034562

(51) Int. Cl.
*H04R 9/08* (2006.01)
*H04R 11/04* (2006.01)
*H04R 17/02* (2006.01)
*H04R 19/04* (2006.01)
*H04R 21/02* (2006.01)
*H04R 1/04* (2006.01)
*H04R 1/06* (2006.01)

(52) U.S. Cl.
CPC .. H04R 1/04 (2013.01); H04R 1/06 (2013.01); H04R 19/04 (2013.01)
USPC .......................................... 381/360; 381/369

(58) Field of Classification Search
USPC ................. 381/355, 361, 369, 170–181, 360; 257/254, 416, 659, 704
See application file for complete search history.

(56) References Cited

U.S. PATENT DOCUMENTS

2008/0157301 A1   7/2008   Ramakrishna et al.
2009/0141913 A1   6/2009   Mauer et al.
(Continued)

FOREIGN PATENT DOCUMENTS

CN         1802039 A      7/2006
JP      2004/349927 A    12/2004
(Continued)

OTHER PUBLICATIONS

Japanese Office Action Application No. 2011-034562, dated Aug. 30, 2011.
(Continued)

*Primary Examiner* — Matthew Eason
(74) *Attorney, Agent, or Firm* — Nutter McClennen & Fish LLP; John J. Penny, Jr.

(57) ABSTRACT

Provided is a microphone capable of reducing a plane area seen from above, and further increasing a capacity of a back chamber of an acoustic sensor. An interposer 52 is mounted on a top surface of a circuit board 43, and an acoustic sensor 51 is mounted on the top surface thereof. A signal processing circuit 53 is accommodated in a space 70 provided in the interposer 52, and mounted on the circuit board 43. The acoustic sensor 51 is connected to the circuit board 43 through a wiring structure provided in the interposer 52. The acoustic sensor 51, the interposer 52 and the like are covered by a cover 42 put on the top surface of the circuit board 43. In the cover 42, a sound introduction hole 48 is opened in a position opposed to the front chamber of the acoustic sensor 51. The interposer 52 is formed with a ventilation notch 71 for acoustically communicating a space below a diaphragm 56 of the acoustic sensor 51 with a space inside the cover 42 and outside the interposer 52.

6 Claims, 14 Drawing Sheets

(56) References Cited

U.S. PATENT DOCUMENTS

| | | | |
|---|---|---|---|
| 2010/0272302 A1* | 10/2010 | Feiertag et al. | 381/361 |
| 2011/0272769 A1* | 11/2011 | Song et al. | 257/416 |
| 2012/0161258 A1* | 6/2012 | Loeppert et al. | 257/416 |

FOREIGN PATENT DOCUMENTS

| | | |
|---|---|---|
| JP | 2005-043159 | 2/2005 |
| JP | 2006-311106 A | 11/2006 |
| JP | 2007-178221 A | 7/2007 |
| JP | 2009-512202 A | 3/2009 |
| WO | 2007-020925 A1 | 2/2007 |

OTHER PUBLICATIONS

Extended European Search Report for Application No. 11770671.3 issued Feb. 4, 2014 (7 Pages).

Chinese Office Action for Application No. 201180001986.9, issued May 4, 2014 (11 pages).

* cited by examiner (PRIOR ART)

(A)

(B)

MICROPHONE

TECHNICAL FIELD

The present invention relates to a microphone, and specifically to a microphone with an acoustic sensor mounted inside a package.

BACKGROUND ART

General Microphone

FIG. 1 is a sectional view showing a microphone with a conventional general structure. This microphone 11 is obtained by mounting an acoustic sensor 15, a signal processing circuit 17 inside a package made up of a cover 12 and a circuit board 13. The acoustic sensor 15 and the signal processing circuit 17 are mounted in the state of being arranged beside each other on the top surface of the circuit board 13, and the signal processing circuit 17 is covered by a sealing resin 21. The acoustic sensor 15 and the signal processing circuit 17 are electrically connected by a bonding wire 18, and further, the signal processing circuit 17 is connected to intra-substrate wiring 14 of the circuit board 13 by a bonding wire 19.

Normally, the under surface of the circuit board 13 is mounted on a printed wiring board, to be brought into intimate contact with the printed wiring board. For this reason, a sound introduction port 20 for introducing an acoustic vibration into a package is opened on the top surface of the cover 12. The under surface of the acoustic sensor 15 is bonded to the circuit board 13, and the under surface of a back chamber 16 is blocked by the circuit board 13.

The microphone 11 having such a structure has a problem as described below. In the microphone 11, with the acoustic sensor 15 and the signal processing circuit 17 arranged beside each other, it is not possible to reduce a projected area to a horizontal plane (hereinafter referred to as plane area) at the time when the microphone 11 is seen from above. In particular, it is impossible to make the plane area of the microphone 11 smaller than the sum of a plane area of the acoustic sensor 15 and a plane area of the signal processing circuit 17.

Further, in the microphone 11, the acoustic sensor 15 and the signal processing circuit 17 are connected by the bonding wire 18. In the case of the bonding wire 18 being stretched and wired, the bonding wire 18 may break due to vibrations or the like, and hence the bonding wire 18 is loosened and wired as shown in FIG. 1. Furthermore, in the case of the bonding wire 18 being loosened downward and wired, the bonding wire 18 may come into contact with an electrode pad or wiring of the acoustic sensor 15 or the signal processing circuit 17 to cause a short-circuit accident, and hence the bonding wire 18 is loosened upward. As a result, the package needs to have enough a height to accommodate the bonding wire 18 protruding upward, and associated therewith, the microphone 11 becomes higher.

There is a correlation between a sensitivity of the microphone and a capacity of the back chamber, and the sensitivity of the microphone decreases with decrease in capacity of the back chamber. In the microphone 11, a capacity of the back chamber 16 inside the acoustic sensor 15 becomes smaller in the case of providing the sound introduction port 20 in the cover 12, and a sensitivity of the microphone 11 is thus apt to decrease.

Microphone of Patent Document 1

FIG. 2 shows a microphone disclosed in Patent Document 1. In a microphone 31 of Patent Document 1, the signal processing circuit 17 is mounted on the top surface of the circuit board 13. In a position adjacent to the signal processing circuit 17, a spacer 32 is fixed to the top surface of the circuit board 13, and further, the acoustic sensor 15 is mounted on the top surface of the spacer 32. In the spacer 32, a vertically penetrating through hole 33 is opened, and a communication hole 34 is further formed for alleviating a difference in static pressure between the outside of the spacer 32 and the inside of the through hole 33.

In such a microphone 31, since the under surface of the acoustic sensor 15 is provided with the electrode pad and the acoustic sensor 15 is electrically connected to the circuit board 13 via the spacer 32, the microphone 31 is not made higher due to the loosened bonding wire 18 as in the microphone 11 of FIG. 1.

However, this microphone 31 has the same problem as the microphone 11 of FIG. 1. Also in the microphone 31, with the acoustic sensor 15 and the signal processing circuit 17 arranged beside each other, it is not possible to reduce a plane area of the microphone 31. Especially, it is not possible to make the plane area of the microphone 31 smaller than the sum of a plane area of the acoustic sensor 15 and a plane area of the signal processing circuit 17.

Further in the microphone 31, the through hole 33 of the spacer 32 is continued to the back chamber 16 of the acoustic sensor 15 to widen a space below a diaphragm, and hence it is substantially possible to expand a capacity of the back chamber 16 without making the acoustic sensor 15 larger. As a result, a sensitivity of the microphone 31 can be expected to improve.

However, even in such a structure, there is a limit on expansion of the capacity of the back chamber 16, and it is small as compared with a capacity of the space inside the package made up of the cover 12 and the circuit board 13.

It is to be noted that the communication hole 34 is opened in a horizontal direction in the spacer 32. However, this communication hole 34 is one for transmitting static pressure between the back chamber 16 and a space outside the acoustic sensor 15 and the spacer 32 (intra-package space), while on the other hand blocking passage of a gas based on pressure fluctuations acting on the diaphragm. That is, the communication hole 34 is one aimed at removing a difference in static pressure on the inside and the outside of the acoustic sensor 15 based on generation of an outgas and a height difference.

Microphone of Patent Document 2

Patent Document 2 discloses a microphone in which a tridimensional circuit board is provided on a printed board constituting a package, an acoustic sensor is mounted on the tridimensional circuit board, and a signal processing circuit is accommodated inside an opening formed in a midsection of tridimensional circuit board.

According to such a microphone as in Patent Document 2, with the acoustic sensor arranged above the signal processing circuit, the plane area of the microphone can be made smaller so as to reduce the microphone in size.

In the microphone of Patent Document 2, the acoustic sensor is provided above the tridimensional circuit board, thereby increasing the capacity of the back chamber of the acoustic sensor in a similar manner to Patent Document 1. However, the signal processing circuit is accommodated inside the opening of the tridimensional circuit board, and hence, again, the capacity of the back chamber is small and improving the sensitivity of the microphone is difficult.

PRIOR ART DOCUMENT

Patent Document

Patent Document 1: Japanese Unexamined Patent Publication No. 2007-178221
Patent Document 2: Japanese Unexamined Patent Publication No. 2006-311106

DISCLOSURE OF THE INVENTION

Problems to be Solved by the Invention

The present invention was made in view of such technical problems as described above, and has an object to provide a microphone capable of reducing a plane area seen from above, and further increasing a capacity of a back chamber of an acoustic sensor.

Means for Solving the Problem

A microphone according to the present invention is a microphone, including: a circuit board; a supporting member, mounted on a top surface of the circuit board; an acoustic sensor, mounted on the supporting member; a signal processing circuit, accommodated inside a hollow that is formed inside the supporting member, and mounted on the top surface of the circuit board; and a cover, covering the acoustic sensor, the supporting member, and the signal processing circuit and fixed to the top surface of the circuit board, wherein the acoustic sensor is formed with a space to serve as a front chamber on the top surface side and is also provided with a space to serve as a back chamber on the under surface side, and the supporting member is formed with an acoustic transmission path capable of transmitting an acoustic vibration between a space located outside the acoustic sensor and the supporting member and the space to serve as the back chamber inside the acoustic sensor, out of spaces surrounded by the cover and the circuit board.

In the microphone of the present invention, with the acoustic sensor arranged above the signal processing circuit, a plane area of the area for mounting the acoustic sensor and the signal processing circuit can be made smaller, so as to reduce the microphone in size. Further, by providing the acoustic transmission path in the supporting member, the space located outside the acoustic sensor and the supporting member out of spaces surrounded by the cover and the circuit board can be used as the back chamber of the acoustic sensor. This can result in a substantially increased capacity of the back chamber of the acoustic sensor, so as to improve the sensitivity of the microphone.

A microphone according to an embodiment of the present invention has a feature in that a sound introduction hole for introducing an acoustic vibration is opened in the cover, and in the acoustic sensor, a periphery of the space to serve as the front chamber is brought into intimate contact with an area surrounding the sound introduction hole on the inner surface of the cover. According to such an embodiment, an acoustic vibration introduced into the microphone through the sound introduction hole resists leakage to the outside of the front chamber. Therefore, an acoustic vibration having entered through the sound introduction hole resists turning to the back chamber side, and the sensitivity of the microphone thus resists a decrease due to an acoustic vibration turned to the back chamber side.

In a microphone according to another embodiment of the present invention, the supporting member is provided with a wiring structure for electrically connecting the acoustic sensor and the circuit board. According to such an embodiment, since the acoustic sensor and the circuit board can be connected to each other without using a bonding wire, the height of the package made up of the cover and the circuit board can be made smaller than in the case of using the bonding wire, so as to reduce the microphone in height and size.

In a microphone according to still another embodiment of the present invention, the acoustic transmission path is formed by recessing a top surface section of the supporting member into concave form or groove form. According to such an embodiment, processing of the acoustic transmission path can be performed with ease.

In a microphone according to yet another embodiment of the present invention, the hollow for accommodating the signal processing circuit vertically penetrates through the supporting member. According to such an embodiment, since the hollow for accommodating the signal processing circuit becomes part of the back chamber of the acoustic sensor, the capacity of the back chamber of the acoustic sensor can be further increased, so as to improve the sensitivity of the microphone.

In a microphone according to yet another embodiment of the present invention, the hollow for accommodating the signal processing circuit is provided in concave form on the under surface of the supporting member, and the hollow and the acoustic transmission path are partitioned by the supporting member. According to such an embodiment, a short-circuit accident does not occur between the acoustic sensor and the signal processing circuit. Further, the signal processing circuit can be protected from moisture, dust and the like.

It is to be noted that the means for solving the above problems in the present invention has features in appropriate combination of the above described constitutional elements, and the present invention enables a large number of variations by combination of such constitutional elements.

BEST MODE FOR CARRYING OUT THE INVENTION

Hereinafter, preferred embodiments of the present invention will be described with reference to the accompanying drawings. However, the following embodiments of the present invention are not restrictive, and a variety of changes in design can be made within the range not deviating from the gist of the present invention.

First Embodiment

Figure 1:
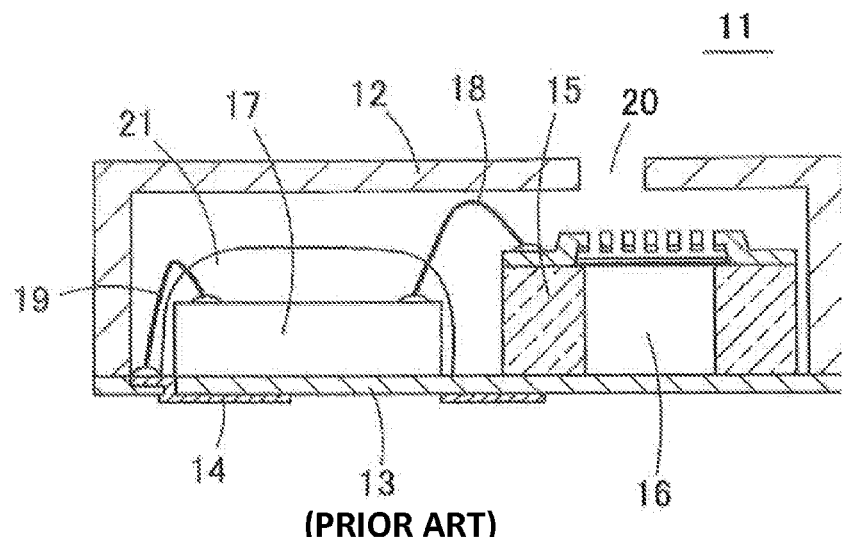
FIG. 1 is a sectional view showing a microphone with a general structure.
Figure 2:
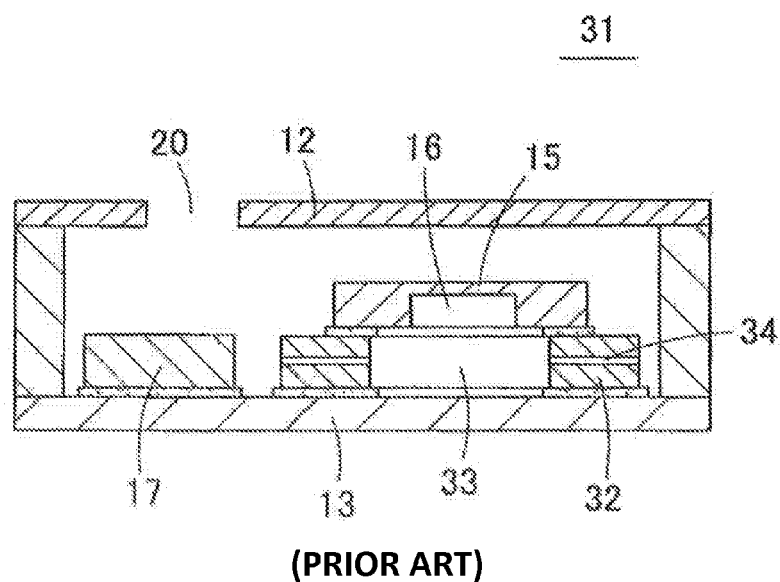
FIG. 2 is a sectional view of a microphone disclosed in Patent Document 1.
Figure 3:
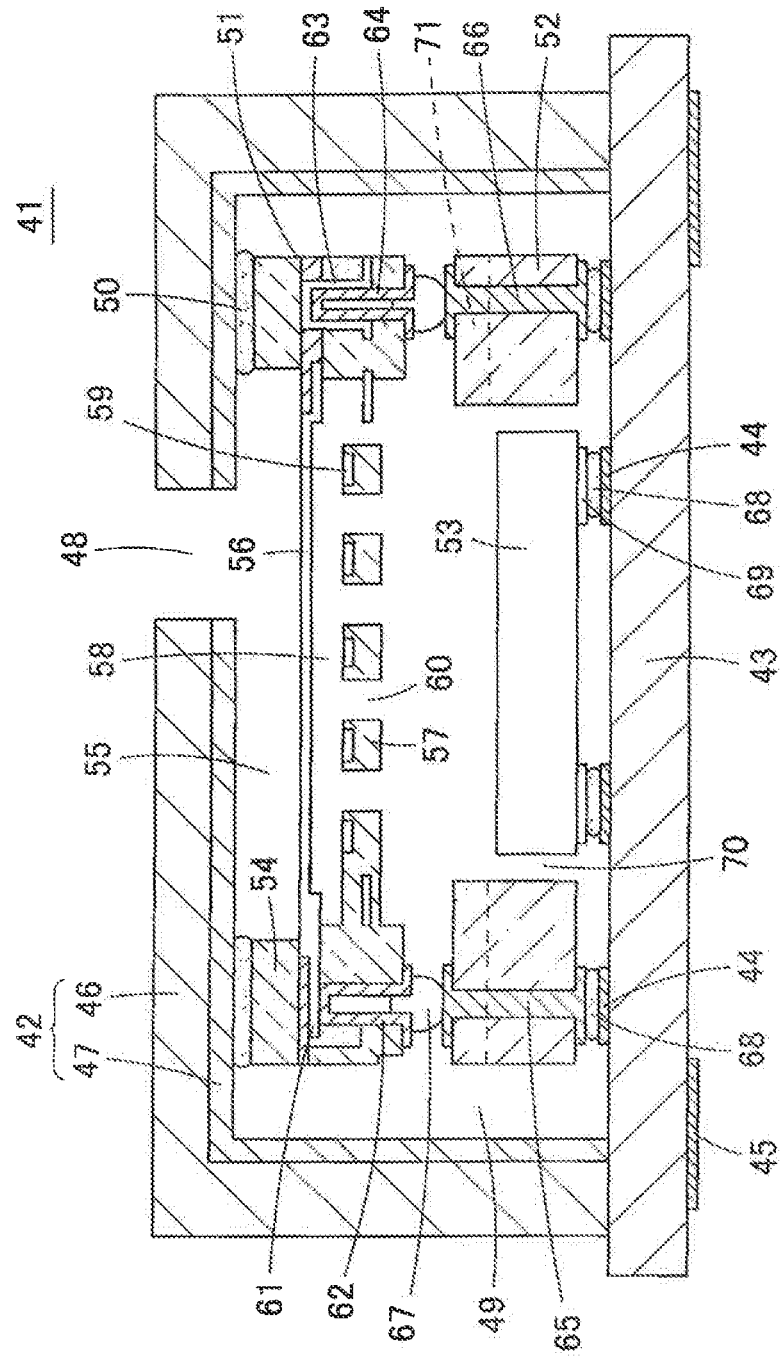
FIG. 3 is a sectional view showing a structure of a microphone according to Embodiment 1 of the present invention.
Figure 4:
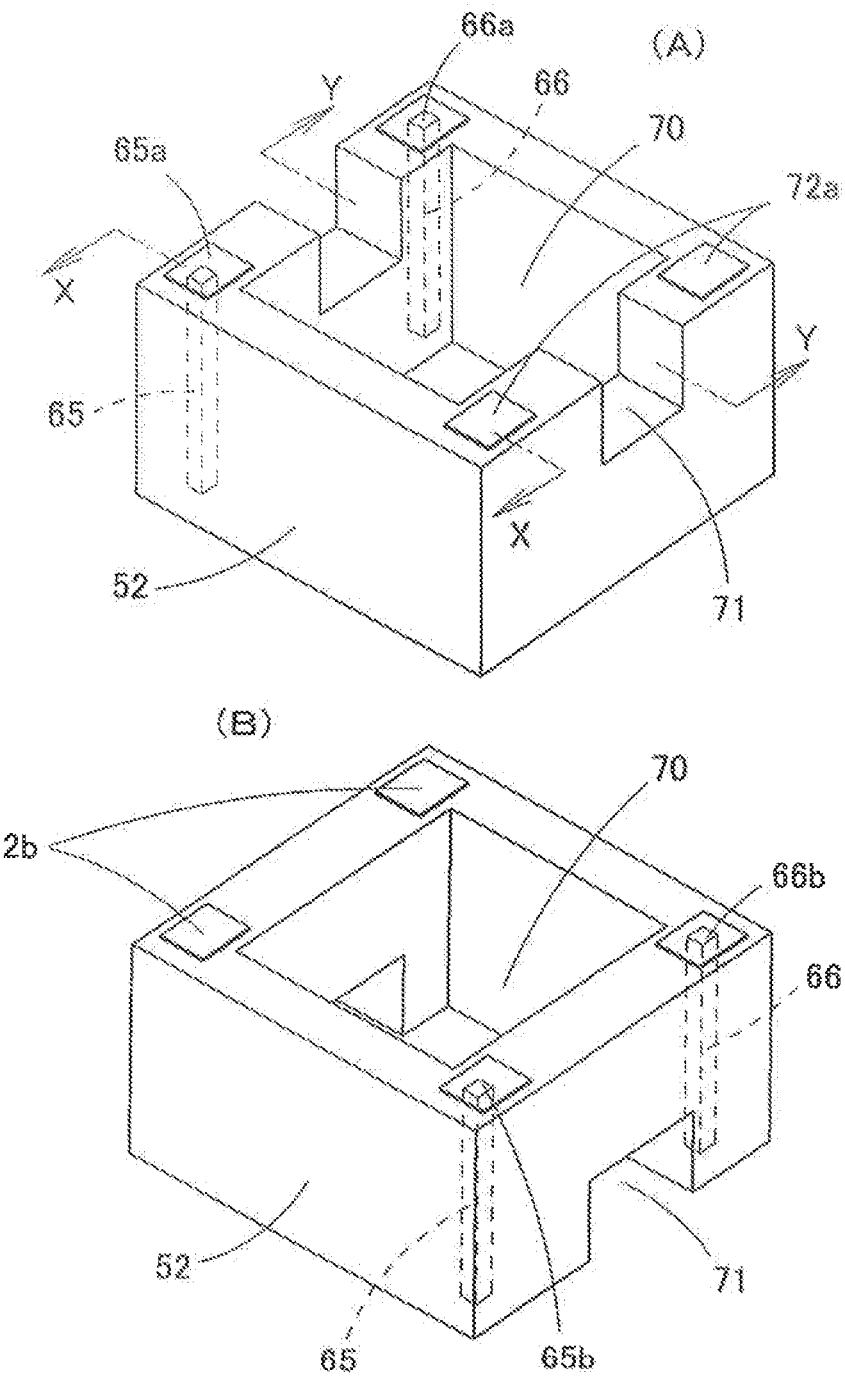
FIG. 4(A) is a perspective view of an interposer used for the microphone according to Embodiment 1.
FIG. 4(B) is a perspective view drawn by vertically inverting the interposer.
Figure 5:
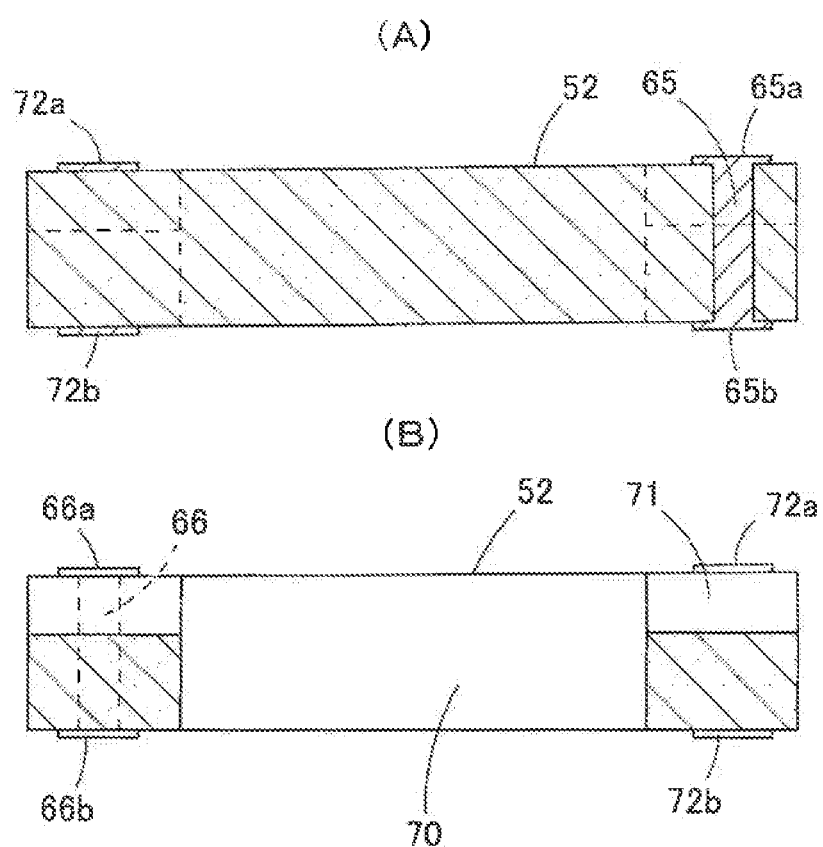
FIG. 5(A) is a sectional view taken along line X-X of FIG. 4(A)
FIG. 5(B) is a sectional view taken along line Y-Y of FIG. 4(A).

A microphone according to Embodiment 1 of the present invention will be described with reference to FIGS. 3 to 5. FIG. 3 is a sectional view showing a structure of a microphone 41 according to Embodiment 1. FIG. 4(A) is a perspective view of an interposer 52 (supporting member) used for the microphone 41, and FIG. 4(B) is a perspective view showing a state where the interposer 52 has been vertically inverted. FIGS. 5(A) and 5(B) are sectional views of the interposer 52, and FIG. 5(A) is a cross section taken along line X-X of FIG. 4(A) while FIG. 5(B) is a cross section taken along line Y-Y of FIG. 4(A).

In the microphone 41, a package is formed of a cover 42 and a circuit board 43. An acoustic sensor 51, the interposer 52 and a signal processing circuit 53 are accommodated inside this package.

On the top surface of the circuit board 43 constituting part of the package, there are provided a plurality of top-surface electrode pads 44 for joining the interposer 52 and the signal processing circuit 53. On the under surface of the circuit board 43, there are provided a plurality of under-surface electrode pads 45 for connecting the microphone 41 to the printed wiring board and the like at the time of mounting the microphone 41 on the printed wiring board and the like. The cover 42 has a box form with the under surface thereof open, and an electromagnetic shield 47 made of a metal plated film is formed on the inner surface of a cover body 46 made of an insulating material (e.g., plastic). Further, a sound introduction hole 48 for introducing an acoustic vibration into the package is opened at least one place in the cover 42.

In addition, the cover body 46 may be made of metal, and in that case, there is no need for separately providing the electromagnetic shield 47 since the cover body 46 has a function of electromagnetic shield.

The acoustic sensor 51 is a capacitance type element produced by use of a MEMS technique. As shown in FIG. 3, the whole of the acoustic sensor 51 is held by a silicon substrate 54. In the silicon substrate 54, a front chamber 55 is opened so as to vertically penetrate therethrough. On the under surface of the silicon substrate 54, a thin film-like diaphragm 56 is provided so as to cover an under-surface opening of a front chamber 55. The diaphragm 56 is formed by polysilicon having conductivity. Therefore, the diaphragm 56 itself serves as a movable electrode plate. A plurality of places at an outer edge of the diaphragm 56 are supported by anchors (not shown), so that the diaphragm 56 is stretched in film form on the under surface of the silicon substrate 54, and a vent hole (narrow gap) is formed between the anchors and between the outer edge of the diaphragm 56 and the under surface of the silicon substrate 54.

A back plate 57 is provided below the diaphragm 56 so as to form an air gap 58 (void) between the back plate 57 and the diaphragm 56, and an outer periphery of the back plate 57 is fixed to the under surface of the silicon substrate 54. Further, on the top surface of the back plate 57, a fixed electrode plate 59 is provided so as to be opposed to the diaphragm 56. The back plate 57 is formed of insulating SiN, and a fixed electrode plate 59 is formed of conductive polysilicon. As a result, the diaphragm 56 and the fixed electrode plate 59, which are opposed to each other via the air gap 58, constitute a capacitor for acoustic vibration sensing.

In almost the whole of the back plate 57 and the fixed electrode plate 59, a large number of acoustic holes 60 are punched for allowing passage of an acoustic vibration after vibration of the diaphragm 56.

A leading wire 61 is extended out from the end of the diaphragm 56. The end of the leading wire 61 is electrically connected with an electrode section 62 embedded in the back plate 57. Further, a leading wire 63 is extended out from the end of the fixed electrode plate 59. The end of the leading wire 63 is electrically connected with an electrode section 64 embedded in the back plate 57. The under surface of the electrode section 62 is protruded from any one place out of four corners of the under surface of the acoustic sensor 51, and a bump 67 is provided on the under surface of the electrode section 62. The under surface of the electrode section 64 is protruded from another corner out of the four corners of the under surface of the acoustic sensor 51, and the bump 67 is provided on the under surface of the electrode section 64. Dummy electrodes (not shown) are provided at corners not provided with the electrode sections 62, 64 out of the four corners of the under surface of the acoustic sensor 51. The dummy electrode is an electrode for mechanical fixing the under surface of the acoustic sensor 51 by means of a solder or the like, the electrode having no electrical function. The dummy electrode is also provided with a bump.

The interposer 52 has such a structure as shown in FIGS. 4(A), 4(B), 5(A) and 5(B). The interposer 52 is formed of an insulating material in rectangular form, and a hollow 70, which vertically penetrates therethrough and is capable of accommodating the signal processing circuit 53, is formed inside the interposer 52. Further, a ventilation notch 71 (acoustic communication path) is formed in the upper portion of the wall surface of the interposer 52.

The interposer 52 is provided with a structure for electrically connecting the acoustic sensor 51 and the circuit board 43. That is, a through electrode 65 is embedded at any one place out of four corners of the interposer 52, a pad section 65a conducted with the through electrode 65 is provided on the top surface of the interposer 52, and a pad section 65*b* conducted with the through electrode 65 is provided on the under surface of the interposer 52. Similarly, a through electrode 66 is embedded at another place out of the four corners of the interposer 52, a pad section 66*a* conducted with the through electrode 66 is provided on the top surface of the interposer 52, and a pad section 66*b* conducted with the through electrode 66 is provided on the under surface of the interposer 52. Further, at corners not provided with the through electrodes 65, 66 out of the four corners of the interposer 52, dummy electrodes 72*a* are provided on the top surface of the interposer 52, and dummy electrodes 72*b* are provided on the under surface of the interposer 52. The dummy electrodes 72*a*, 72*b* are electrodes for fixing the interposer 52 by mechanical connection, and the dummy electrode 72*a* on the top surface and the dummy electrode 72*b* on the under surface are not electrically conducted to each other.

It is to be noted that, although the ventilation notch 71 is formed in the upper portion of the wall surface of the interposer 52 in FIGS. 4 and 5, the ventilation notch 71 may be provided in the lower portion of the wall surface of the interposer 52. Further, a ventilation opening (acoustic transmission path) may be opened in window form on the wall surface of the interposer 52. However, the acoustic transmission paths such as the ventilation notch and the ventilation opening are each required to have a path sectional area large enough to transfer a dynamic pressure change due to an acoustic vibration.

Further, the signal processing circuit 53 (ASIC) is a circuit that amplifies an acoustic sensing signal outputted from the acoustic sensor 51, further converts the signal to a digital signal, and outputs the converted signal. An electrode section 69 for inputting a signal from the acoustic sensor 51 and an electrode section 69 for outputting a signal subjected to signal processing are provided on the under surface of the signal processing circuit 53.

The microphone 41 is assembled in such a manner as follows. The acoustic sensor 51 is placed on the interposer 52, the bump 67 provided on the under surface of the electrode section 62 is bonded to the top surface (pad section 65*a*) of the through electrode 65, and the bump 67 provided on the under surface of the electrode section 64 is joined to the top surface (pad section 66*a*) of the through electrode 66. Further, the bump 67 of the dummy electrode provided on the under surface of the acoustic sensor 51 is joined to the dummy electrode 72*a* on the top surface of the interposer 52. This results in mechanical fixing of the acoustic sensor 51 to the top surface of the interposer 52 by the bumps 67 at the four places. Further, the electrode sections 62, 64 of the acoustic sensor 51 are respectively conducted to the lower surface (pad sections 65*b*, 66*b*) of the interposer 52 through the through electrodes 65, 66.

The pad sections 65*b*, 66*b* and the dummy electrodes 72*b* provided on the under surface of the interposer 52 are joined to the top-surface electrode pads 44 of the circuit board 43 by a conductive material 68 such as solder or a conductive adhesive. The electrode section 69 of the signal processing circuit 53 is also joined to the top-surface electrode pads 44 of the circuit board 43 by the conductive material 68 such as the solder or the conductive adhesive.

The cover 42 is superposed on the top surface of the circuit board 43 so as to cover the acoustic sensor 51, the interposer 52 and the signal processing circuit 53 which are superposed on the top surface of the circuit board 43. At this time, a sound introduction hole 48 of the cover 42 is arranged so as to border the inside of the front chamber 55 of the acoustic sensor 51. The whole periphery of the top surface of the acoustic sensor 51 (top surface of the silicon substrate 54) is bonded to the inner surface of the cover 42 by use of an adhesive resin 50, to seal the whole of the top surface. The under surface of the cover 42 is bonded to the top surface of the circuit board 43 by the conductive adhesive, and the electromagnetic shield 47 is conducted to a ground electrode of the circuit substrate 43.

Accordingly, upon entering of an acoustic vibration into the microphone 41 through the sound introduction hole 48, the acoustic vibration is guided into the front chamber 55 of the acoustic sensor 51. Since the acoustic vibration vibrates the diaphragm 56, it changes a capacitance of the capacitor configured by the diaphragm 56 and the fixed electrode plate 59, and this change in capacitance is outputted from the electrode sections 62, 64 as acoustic sensing signals. The acoustic sensing signals outputted from the acoustic sensor 51 are transmitted to the top-surface electrode pads 44 through the through electrodes 65, 66. The top-surface electrode pads 44, joined with the pad sections 65*b*, 66*b* of the through electrodes 65, 66, are conducted to the top-surface electrode pads 44 joined with the electrode section 69 for signal input of the signal processing circuit 53 by means of a wiring pattern (not shown) provided on the top surface of the circuit board 43 or on the inside thereof. Hence the acoustic sensing signals of the acoustic sensor 51 are each inputted from the electrode section 69 for signal input into the signal processing circuit 53. Further, the top-surface electrode pad 44, joined with the electrode section 69 for signal output, is connected to the under-surface electrode pad 45 of the circuit board 43 by a wiring structure (not shown) provided inside the circuit board 43. Therefore, an output signal processed in the signal processing circuit 53 is outputted from the under-surface electrode pad 45 of the circuit board 43 to the outside.

It is to be noted that, since the electrical connection form between the acoustic sensor 51 and the signal processing circuit 53, the number of through electrodes in the interposer 52, and the like change depending on the configurations of the acoustic sensor 51 and the signal processing circuit 53, the above description represents one example.

In the acoustic sensor 51 with such a configuration, it is possible to obtain such function effect as follows. In the acoustic sensor 51, the signal processing circuit 53 is connected with the acoustic sensor 51 through the through electrodes 65, 66 provided in the interposer 52. This eliminates the need for considering a loosened portion of the bonding wire as in the case of connection by use of the bonding wire, thereby preventing the acoustic sensor 51 from being made unnecessarily high.

Further, since the acoustic sensor 51 and the signal processing circuit 53 are vertically arranged, there is eliminated the need for the area for mounting the signal processing circuit 53 apart from the area for mounting the acoustic sensor 51, and it is thereby possible to make the plane area of the microphone 41 very small as compared with the case of those being arranged beside each other as in a conventional manner. Therefore, even in a case where the acoustic sensor 51 or the signal processing circuit 53 cannot be reduced in size, the microphone 41 can be reduced in size.

In this acoustic sensor 51, a space surrounded by the silicon substrate 54 between the sound introduction hole 48 and the diaphragm 56 serves as a front chamber 55. On the other hand, a space on the under surface side of the diaphragm 56 serves as the back chamber of the acoustic sensor 51. However, the acoustic vibration after passage of the diaphragm 56 passes through the acoustic holes 60, expands to the hollow 70 inside the interposer 52, further passes through the ventilation notch 71, and expands to an intra-package space 49. Herein, the intra-package space 49 refers to a space on the outsides of the acoustic sensor 51 and the interposer 52 out of spaces surrounded by the cover 42 and the circuit board 43. Accordingly in the acoustic sensor 51, a space in combination of the space below the diaphragm 56 of the acoustic sensor 51, the hollow 70 inside the interposer 52 and the intra-package space 49 substantially serves as the back chamber. That is, in this microphone 41, almost all the spaces out of the spaces inside the package, except for the front chamber 55, serve as the back chamber.

A sensitivity of the acoustic sensor 51 improves more with a larger capacity of the back chamber. In this microphone 41, most of the space inside the package can be used as the back chamber, and hence the sensitivity of the acoustic sensor 51 can be improved.

In addition, the microphone 31 shown in Patent Document 1 is formed with the communication hole 34 in the horizontal direction in the spacer 32. However, differently from the ventilation notch 71 of the present embodiment, this is one to alleviate a difference in static pressure between the inside and the outside of the back chamber which is generated due to thermal expansion, a pressure change or the like, and is not one to transfer an acoustic vibration. In the microphone 31 of Patent Document 1, when the path sectional area of the communication hole 34 is made large enough to transfer an acoustic vibration, the capacity of the back chamber of the acoustic sensor 15 increases. However, when the path sectional area of the communication hole 34 is increased in the microphone 31, the front chamber and the back chamber of the acoustic sensor 15 are communicated with each other, and hence the sensitivity of the acoustic sensor 15 cannot be obtained. Further, although the ventilation hole is also formed between the tridimensional circuit board and the printed board in Patent Document 2, this ventilation hole is provided for the same purpose as the communication hole in Patent Document 1.

Moreover, in the microphone 41 of the present embodiment, since the electromagnetic shield 47 is formed on the inner surface of a cover 42 (an electromagnetic shield may be provided inside the circuit board 43), the acoustic sensor 51 and the signal processing circuit 53 can be shut off from foreign noise, leading to improvement in S/N ratio of the microphone 41.

Manufacturing Method for Microphone of First Embodiment

Figure 6:
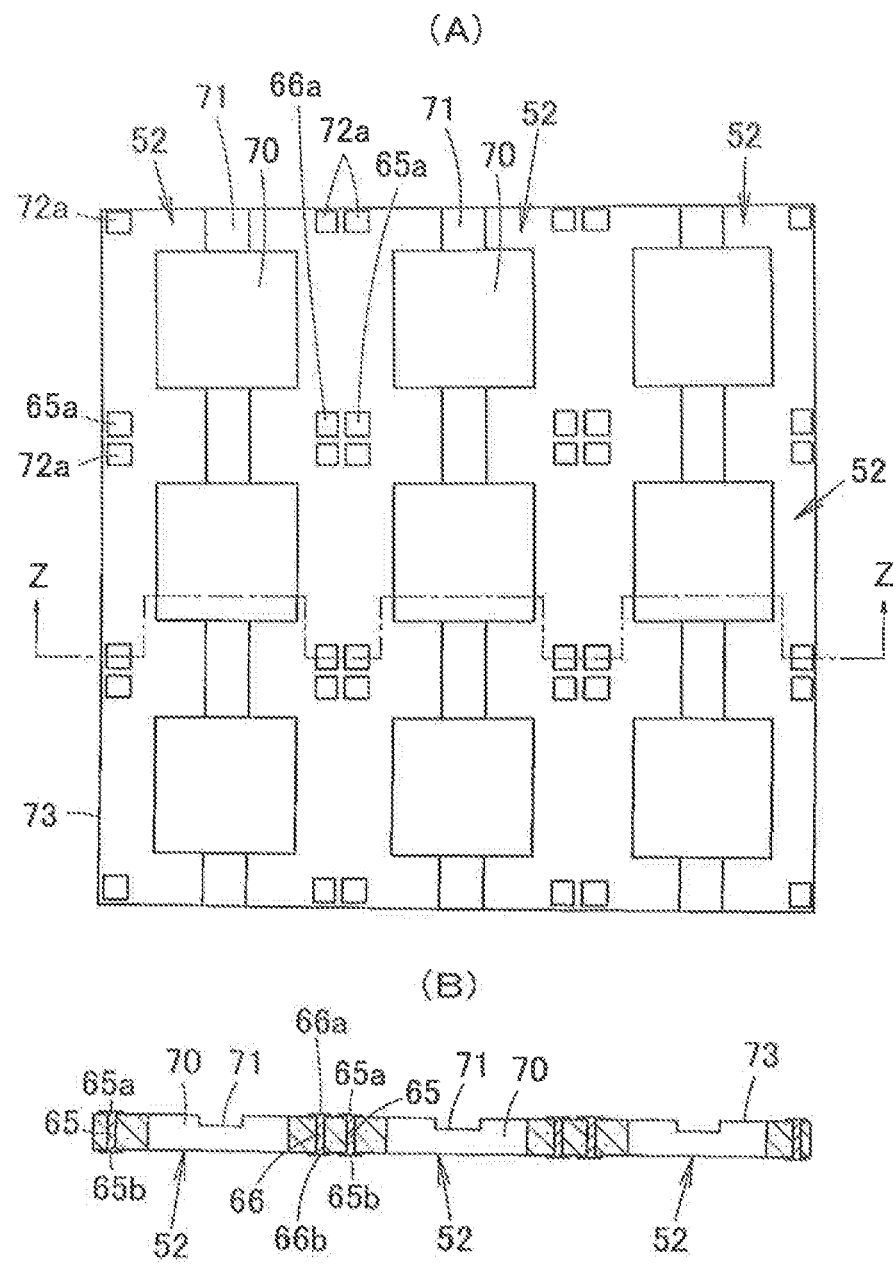
FIG. 6(A) is a plan view showing part of a manufacturing process for the microphone, and a state where a plurality of interposers have been produced at once.
FIG. 6(B) is a sectional view taken along line Z-Z of FIG. 6(A).
Figure 7:
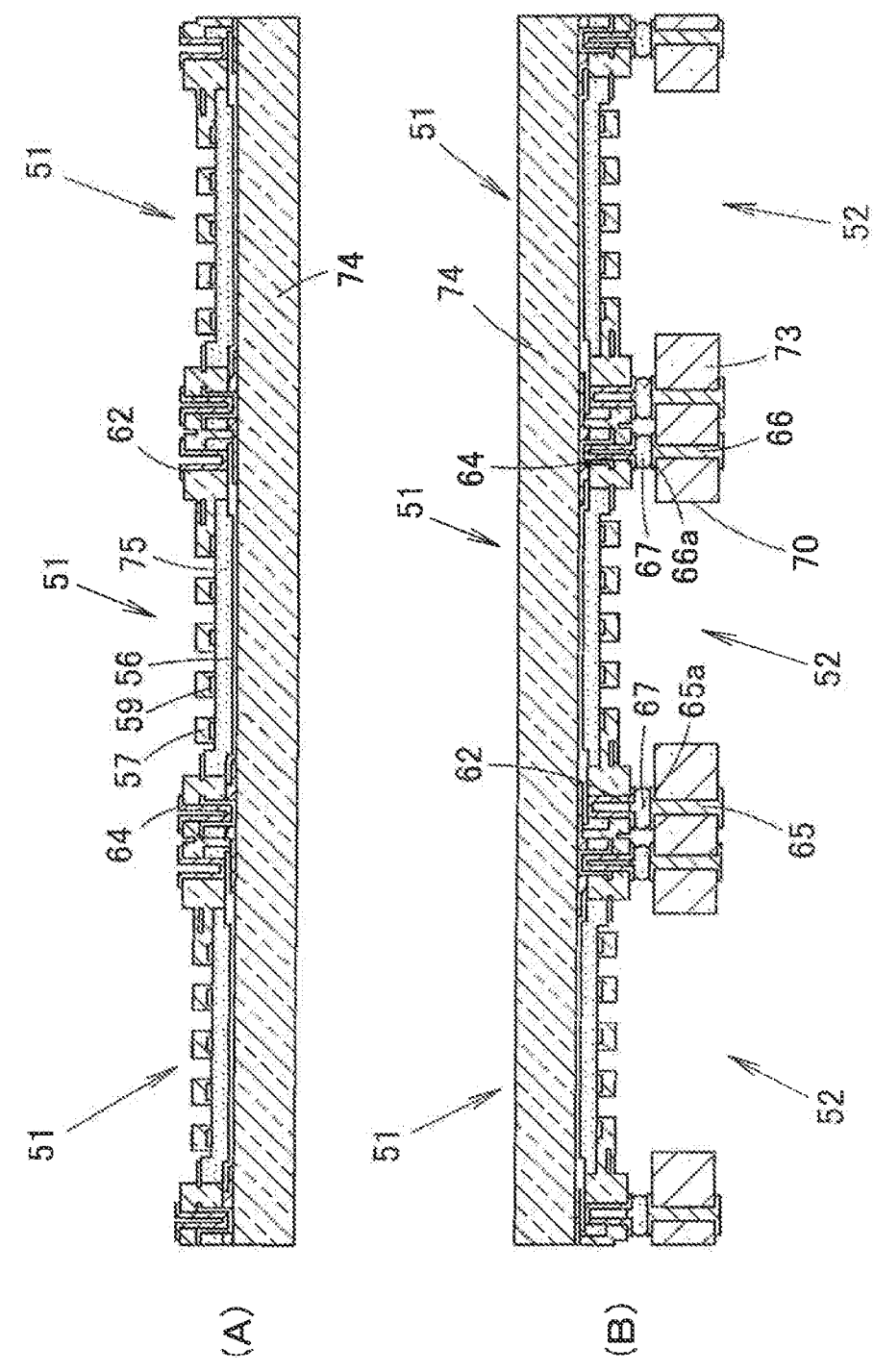
FIG. 7(A) is a sectional view showing part of the manufacturing process for the microphone, and a state where a plurality of acoustic sensors have been produced at once.
FIG. 7(B) is a sectional view showing a state where the acoustic sensor of FIG. 7(A) has been integrally joined onto the interposer of FIG. 6 in a vertically inverted manner.
Figure 8:
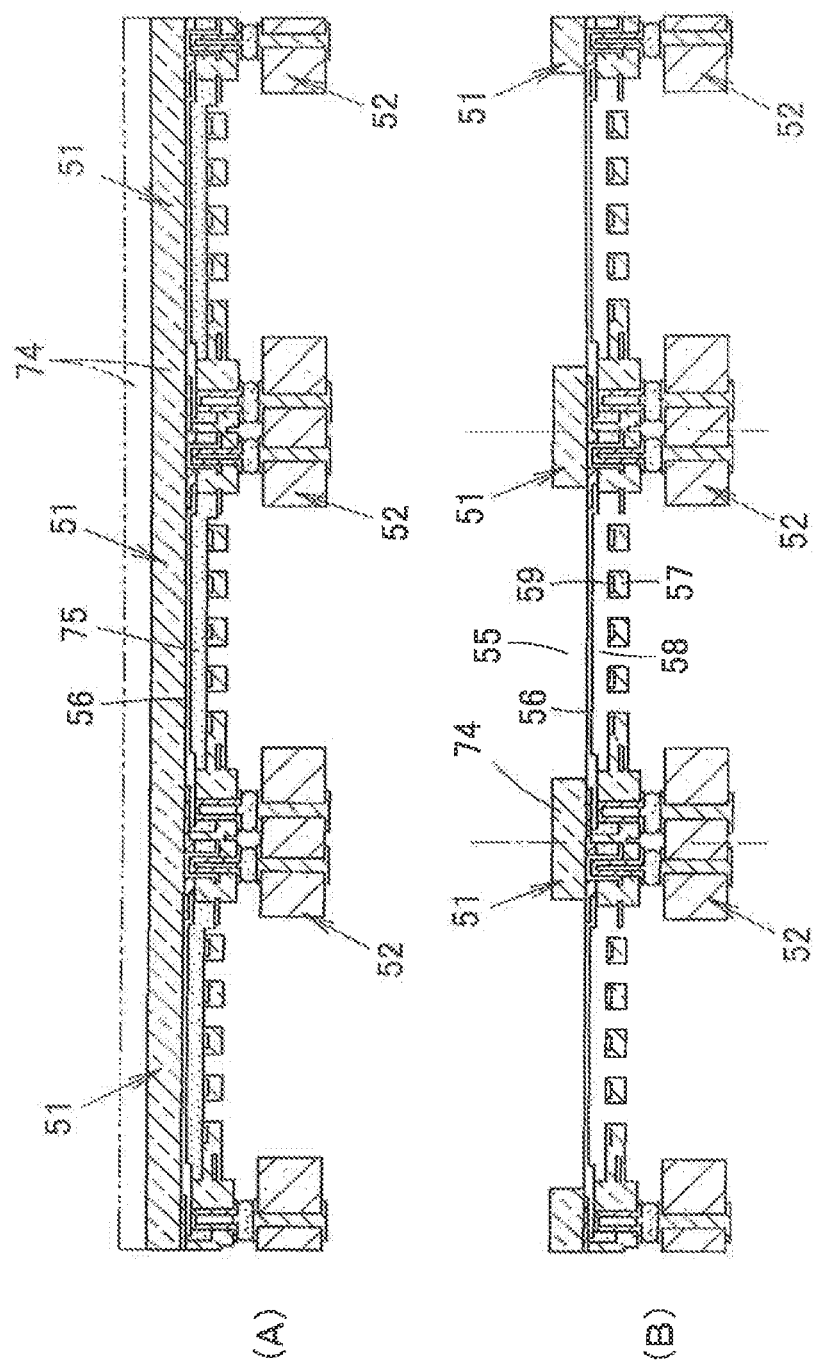
FIG. 8(A) is a sectional view explaining a step of polishing and thinning a Si wafer of the acoustic sensor.
FIG. 8(B) is a sectional view showing a state where a front chamber has been opened in the Si wafer of the acoustic sensor while a sacrifice layer has been removed by etching.
Figure 9:
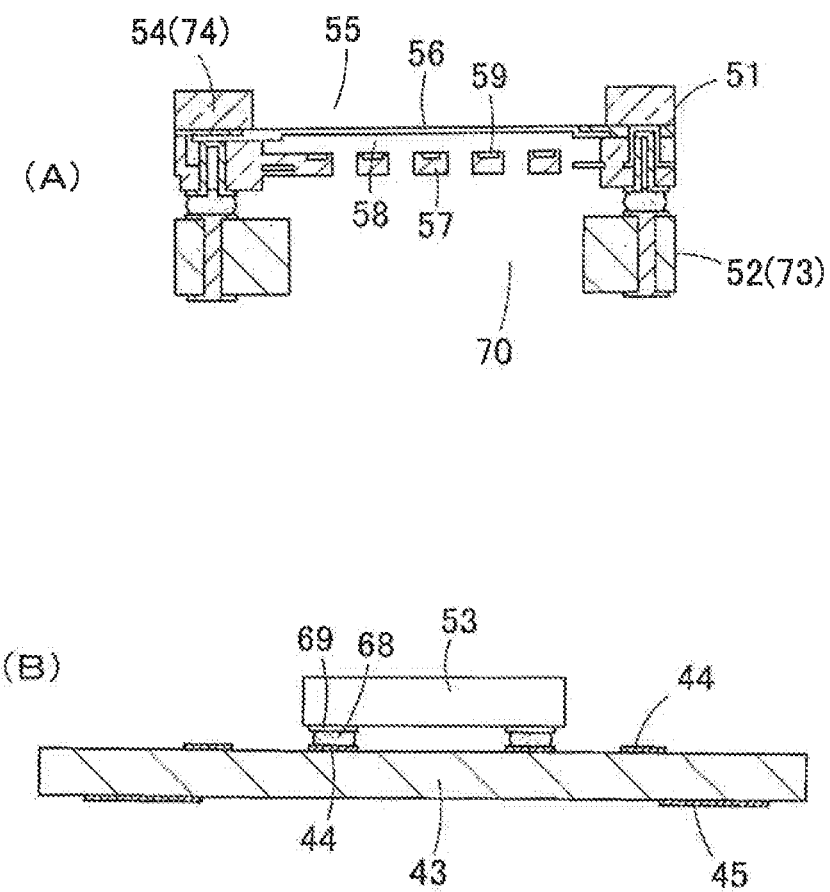
FIG. 9(A) is a sectional view showing one acoustic sensor and one interposer, into which division has been made by dicing.
FIG. 9(B) is a sectional view explaining a step of mounting the signal processing circuit on the top surface of the circuit board.
Figure 10:
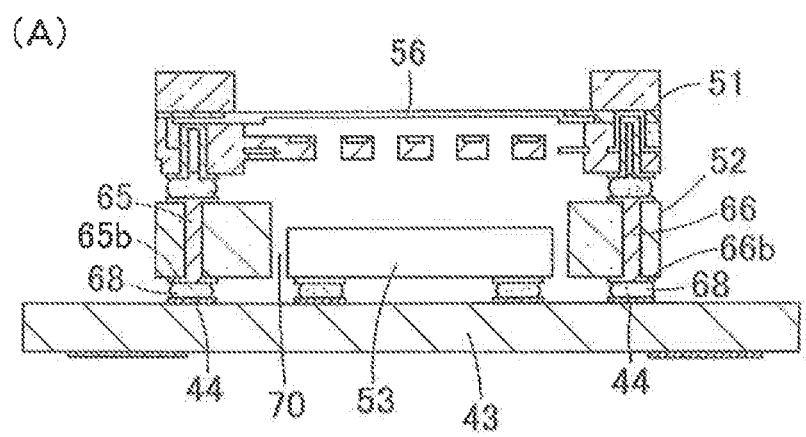
FIG. 10(A) is a sectional view showing a state where the acoustic sensor and the interposer have been mounted on the circuit board so as to cover the signal processing circuit.
FIG. 10(B) is a sectional view showing a state where a cover has been attached to the top surface of the circuit board.
Figure 10:
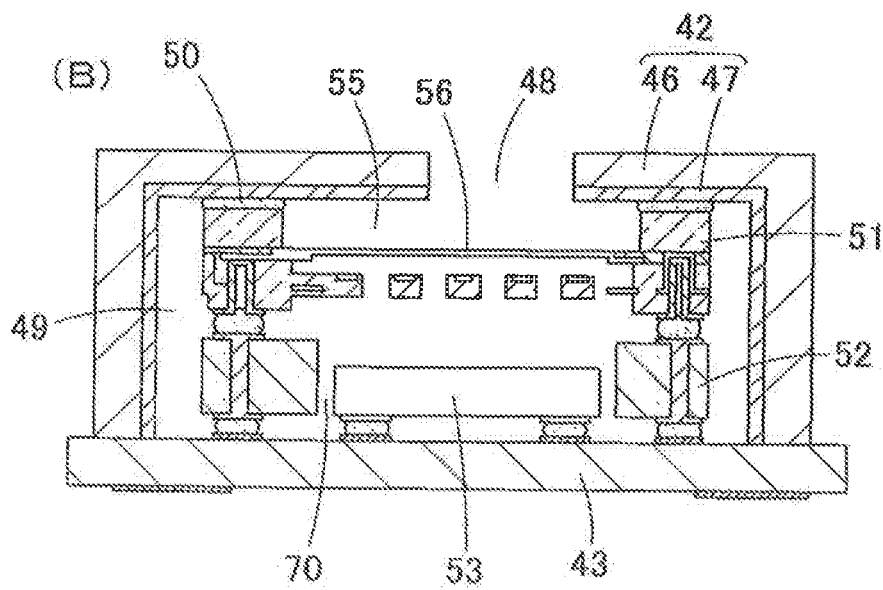

Next, a process for manufacturing the microphone 41 of Embodiment 1 will be described with reference to FIGS. 6 to 10. A plurality of interposers 52 are produced at once. FIG. 6(A) is a plan view showing the plurality of integrally produced interposers 52. FIG. 6(B) is a sectional view taken along line Z-Z of FIG. 6(A). The plurality of interposers 52 are produced in such a manner as follows. The under surface of an insulating Si wafer 73 is subjected to metal plating or vapor deposition, to form the pad sections 65b, 66b and the dummy electrodes 72b at respective predetermined positions. Subsequently, through holes are formed in the Si wafer 73 at the positions of the pad sections 65b, 66b. A metal material is deposited by plating or the like inside the through holes, to produce the through electrodes 65, 66. Further, the pad sections 65a, 66a are formed by metal plating or vapor deposition on the top surface of the Si wafer 73 at the positions of the through electrodes 65, 66. Simultaneously with this, the dummy electrodes 72a are formed at predetermined positions on the top surface of the Si wafer 73. Subsequently, a mid-section of an area surrounded by a set of the pad sections 65a, 66a and the dummy electrodes 72a is etched so as to open the vertically penetrating hollow 70. Further, the top surface of the Si wafer 73 is etched into groove form, to form the ventilation notches 71. FIGS. 6(A) and 6(B) represent the plurality of interposers 52 as thus integrally produced.

A plurality of acoustic sensors 51 are also produced at once. FIG. 7(A) is a sectional view showing the plurality of integrally produced acoustic sensors 51. On the top surface of a Si wafer 74, the polysilicon-made diaphragm 56 is provided in each area to serve as the acoustic sensor 51. A sacrifice layer 75 is formed on the diaphragm 56, and the fixed electrode plate 59 and the back plate 57 are provided on the top surface of the sacrifice layer 75. Further, the electrode sections 62, 64 and the dummy electrodes are provided at the respective corners of each area to serve as the acoustic sensor 51.

As shown in FIG. 7(B), the acoustic sensor 51 produced as in FIG. 7(A) is vertically inverted and superposed on the top surface of the interposer 52 of FIG. 6, and the electrode section 62, the electrode section 64 and the dummy electrodes are respectively joined with the pad section 65a, the pad section 66a and the dummy electrodes 72a by the bumps 67. As a result, the Si wafer 74 which is configured by the plurality of acoustic sensors 51 and the Si wafer 73 which is configured by the plurality of interposers 52 are integrally bonded together.

Subsequently, as shown in FIG. 8(A), the top surface of the acoustic sensor 51 is polished to decrease a thickness of the Si wafer 74. If the acoustic sensor 51 formed in one Si wafer 74 is singly provided, polishing the Si wafer 74 to reduce the thickness thereof causes occurrence of clapping or chipping in the Si wafer 74 in the polishing step or a subsequent step, thereby decreasing a yield of the acoustic sensor 51. However, in the manufacturing method described herein, the Si wafer 74 is polished in the state of the two Si wafers, namely the Si wafer 73 and the Si wafer 74, being bonded together, and it is thereby possible to perform the polishing while enhancing the rigidity of the Si wafer 74 so as to polish the Si wafer 74 with ease and a favorable yield.

Thereafter, as shown in FIG. 8(B), the sacrifice layer 75 of the acoustic sensor 51 is removed by etching, to form the air gap 58 between the diaphragm 56 and the fixed electrode plate 59. This results in formation of the diaphragm 56 into the form of a vibratable film. Subsequently, the Si wafers 74, 73 are subjected to dicing along a cutting line indicated by a dashed line in FIG. 8(B). As a result, as shown in FIG. 9(A), the acoustic sensor 51 and the interposer 52 are separated one by one while remaining vertically bonded.

Next, the signal processing circuit 53 is flip-chip mounted on the top surface of the circuit board 43, and the electrode sections 69 of the signal processing circuit 53 are joined to the top-surface electrode pads 44 of the circuit board 43 by the conductive material 68. In such a manner, the signal processing circuit 53 mounted on the circuit board 43 is shown in FIG. 9(B).

Subsequently, as shown in FIG. 10(A), the interposer 52 and the acoustic sensor 51 are superposed on the circuit board 43 so as to cover the signal processing circuit 53, and the signal processing circuit 53 is accommodated inside the hollow 70 of the interposer 52. At this time, the pad sections 65b, 66b and the dummy electrodes 72b of the interposer 52 are respectively joined to the top-surface electrode pads 44 of the circuit board 43 by the conductive material 68.

Thereafter, as shown in FIG. 10(B), the cover 42 is superposed on the circuit board 43 so as to cover the acoustic sensor 51, the interposer 52 and the signal processing circuit 53. The sound introduction hole 48 has previously been opened in the cover 42, and when the cover 42 is superposed on the circuit board 43, the sound introduction hole 48 is accommodated inside the upper-surface opening of the front chamber 55. Subsequently, the under surface of the cover 42 is joined to the circuit board 43 by the conductive adhesive. Simultaneously with this, the top surface of the acoustic sensor 51 is bonded to the inner surface of the cover 42 by the adhesive resin 50, to seal the space between the whole periphery of the top surface of the acoustic sensor 51 and the inner surface of the cover 42, so as to prevent an acoustic vibration having entered through the sound introduction hole 48 from leaking through a gap between the acoustic sensor 51 and the cover 42.

When the microphone 41 is manufactured in such a manner, the Si wafer 74 resists occurrence of crapping and chipping at the time of polishing the Si wafer 74, thereby leading to improvement in yield in the manufacturing process for the microphone 41. Further, with the Si wafer 74 resisting occurrence of crapping or chipping in the Si wafer 74, the Si wafer 74 can be reduced in thickness by polishing, so as to reduce the acoustic sensor 51 in height. When the acoustic sensor 51 can be reduced in height, the cover 42 with a small height can be used, so that the microphone 41 can be reduced in height and size.

Second Embodiment

Figure 11:
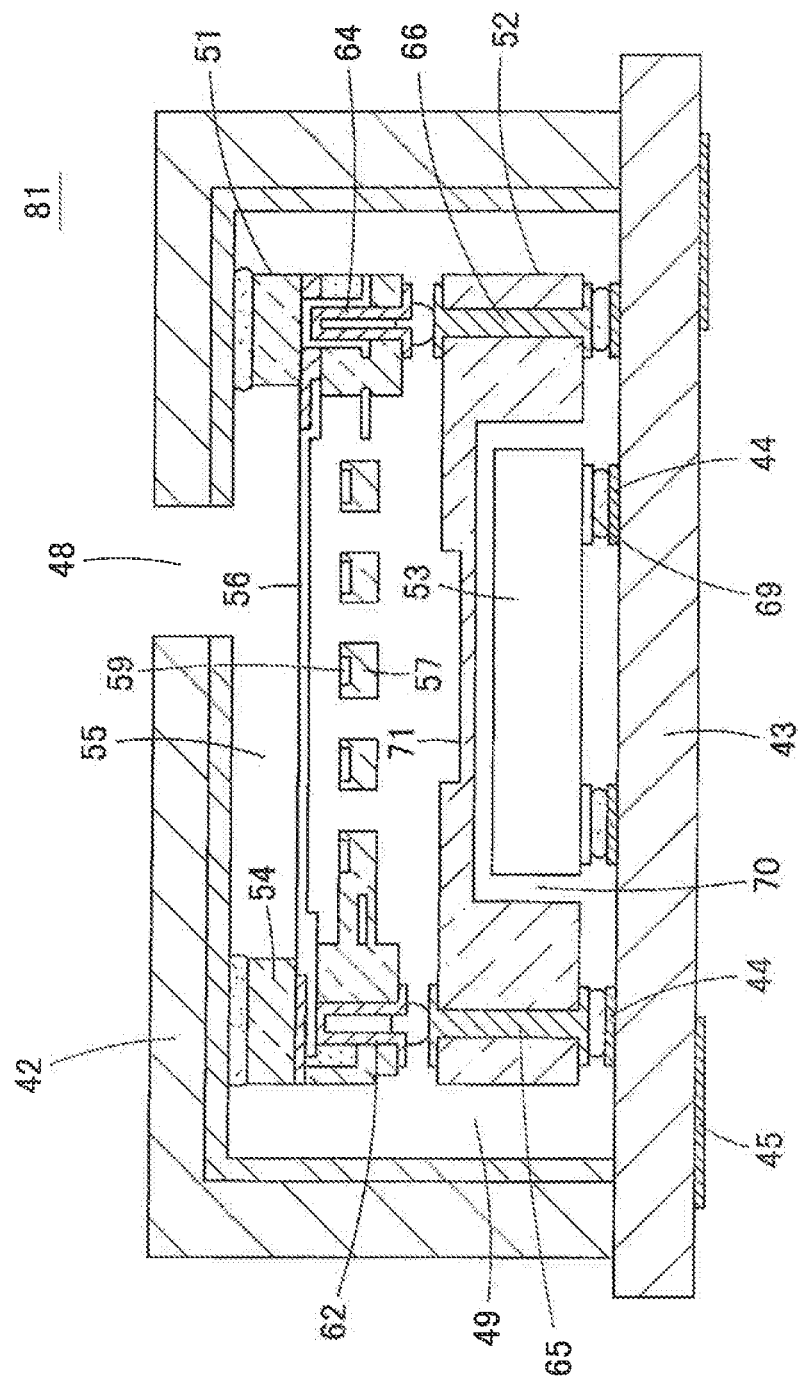
FIG. 11 is a sectional view showing a structure of a microphone according to Embodiment 2 of the present invention.

FIG. 11 is a sectional view showing a microphone 81 according to Embodiment 2 of the present invention. This microphone 81 differs from the microphone 41 of Embodiment 1 only in the shape of the interposer 52. Therefore, descriptions of the microphone 81 of Embodiment 2 will be omitted except for a description of the interposer 52.

Figure 12:
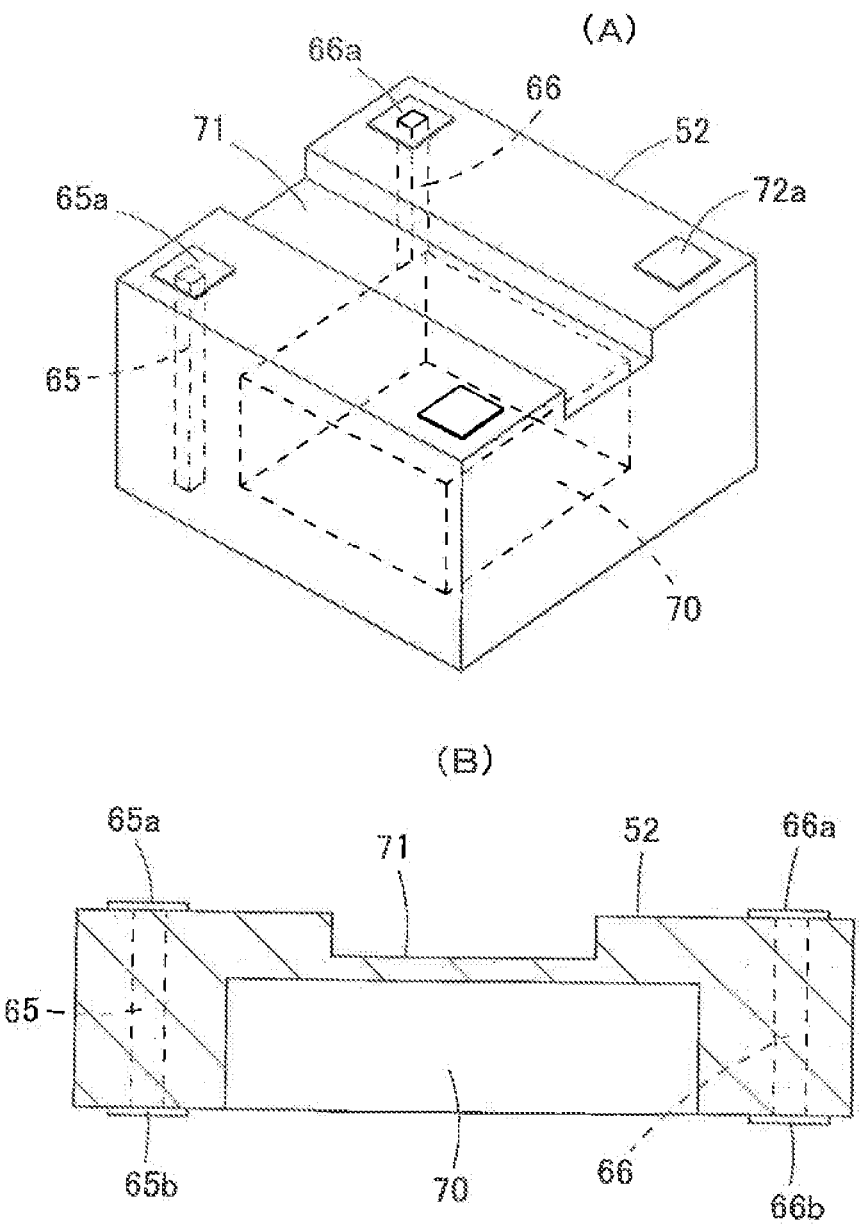
FIGS. 12(A) and 12(B) are a perspective view and a sectional view of an interposer used for the microphone according to Embodiment 2.

In the interposer 52 used for the microphone 81, the hollow 70 for accommodating the signal processing circuit 53 is formed in box form with the under surface thereof open and the top surface thereof closed, as shown in FIGS. 12(A) and 12(B). On the other hand, ventilation notches 71 in the form of one or a plurality of grooves are provided on the top surface of the interposer 52.

Therefore, the space (back chamber) below the diaphragm 56 of the acoustic sensor 51 is communicated with the intra-package space 49 through the ventilation notch 71, not via the hollow 70 for accommodating the signal processing circuit 53. This enables the capacity of the back chamber to substantially increase, so as to improve the sensitivity of the microphone 81.

Further, in this microphone 81, the vertically arranged acoustic sensor 51 and the signal processing circuit 53 are partitioned by the interposer 52, and it is thereby possible to prevent a short-circuit accident between the acoustic sensor 51 and the signal processing circuit 53, and the like. Moreover, with the signal processing circuit 53 covered by the interposer 52, it is possible to protect the signal processing circuit 53 from moisture and dust having entered through the sound introduction hole 48.

Other Embodiments

Figure 13:
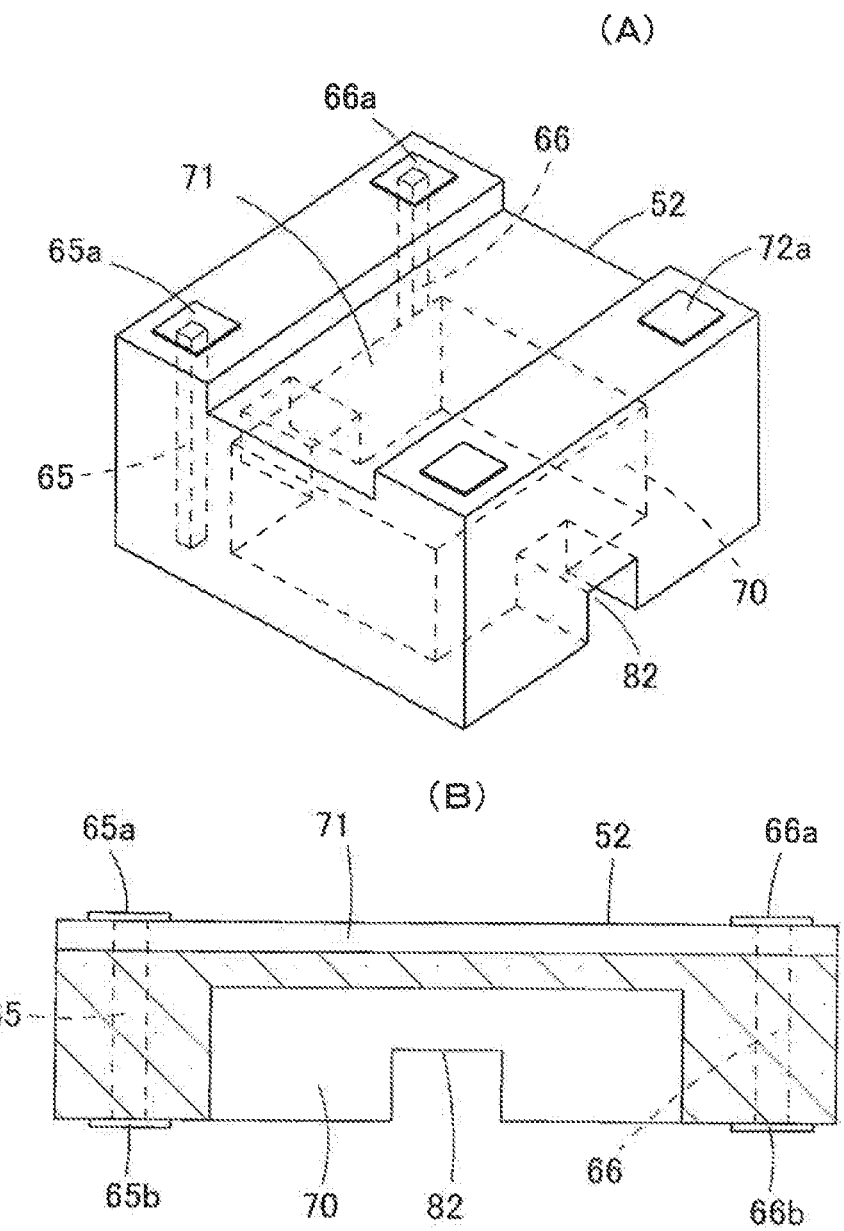
FIG. 13(A) is a perspective view showing an interposer in different form.
FIG. 13(B) is a sectional view thereof.

The interposer 52 can be formed with a variety of structures other than the structures as described in Embodiments 1, 2. For example, in an embodiment shown in FIGS. 13(A) and 13(B), in the interposer 52 where the hollow 70 and the ventilation notch 71 are separated as in Embodiment 2, a ventilation notch 82 for communicating the hollow 70 and the intra-package space 49 is provided in the lower portion of the interposer 52 so that the inside of the hollow 70 can also be used as the back chamber.

Figure 14:
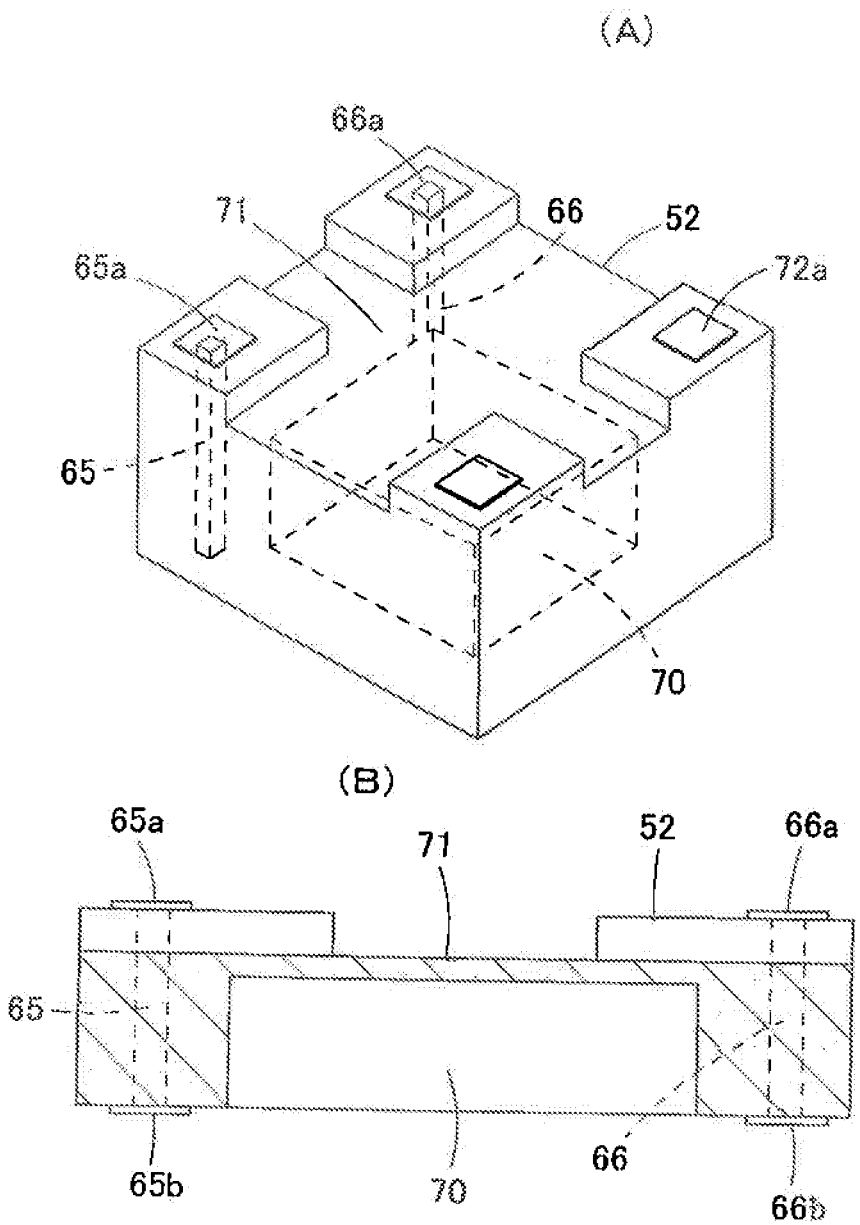
FIG. 14(A) is a perspective view showing an interposer in further different form.
FIG. 14(B) is a sectional view thereof.

Further, in an embodiment shown in FIGS. 14(A) and 14(B), the ventilation notch 71 provided on the top surface of the interposer 52 separately from the hollow 70 is formed into the form of a crossed groove.

Figure 15:
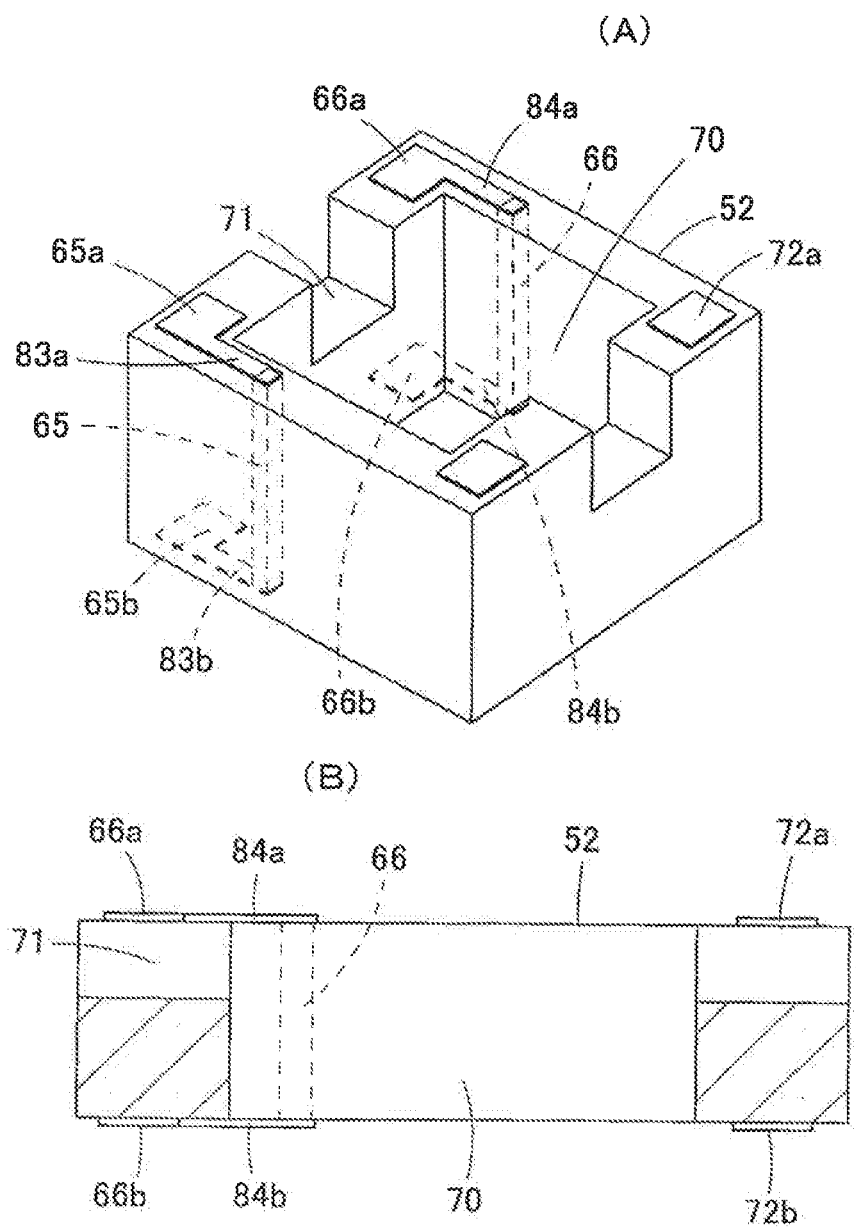
FIG. 15(A) is a perspective view showing an interposer in further different form.
FIG. 15(B) is a sectional view thereof.

One shown in FIGS. 15(A) and 15(B) is still another embodiment. In this interposer 52, an extended electrode section 83a is extended out from the pad section 65a along the top surface of the interposer 52 while an extended electrode section 83b is extended out from the pad section 65b along the under surface of the interposer 52, and the tip of the extended electrode section 83a and the tip of the extended electrode section 83b are connected by the through electrode 65. Similarly, an extended electrode section 84a is extended out from the pad section 66a along the top surface of the interposer 52 while an extended electrode section 84b is extended out from the pad section 66b along the under surface of the interposer 52, and the tip of the extended electrode section 84a and the tip of the extended electrode section 84b are connected by the through electrode 66. According to such an embodiment, it is possible to provide the through electrodes 65, 66 at free positions.

DESCRIPTION OF SYMBOLS 41, 81: microphone
42: cover
43: circuit board
48: sound introduction hole
51: acoustic sensor
52: interposer
53: signal processing circuit
55: front chamber
56: diaphragm
57: back plate
59: fixed electrode plate
66, 66: through electrode
65a, 65b, 66a, 66b: pad section
70: hollow
71, 82: ventilation notch
72a, 72b: dummy electrode
83a, 83b, 84a, 84b: extended electrode section

The invention claimed is:
1. A microphone, comprising:
a circuit board;
a supporting member, mounted on a top surface of the circuit board;
an acoustic sensor, mounted on the supporting member;
a signal processing circuit, accommodated inside a hollow that is formed inside the supporting member, and mounted on the top surface of the circuit board; and
a cover, covering the acoustic sensor, the supporting member, and the signal processing circuit and fixed to the top surface of the circuit board,
wherein
the acoustic sensor is formed with a first space to serve as a front chamber on a top surface side of the acoustic sensor, wherein the first space is inside the acoustic sensor, and the acoustic sensor is also provided with a second space to serve as a back chamber on the under surface side of the acoustic sensor, and
the supporting member is formed with an acoustic transmission path capable of transmitting an acoustic vibration between a third space located outside the acoustic sensor and the supporting member and surrounded by the cover and the circuit board, and the second space to serve as the back chamber inside the acoustic sensor wherein the top surface side of the acoustic sensor is bonded to an inner surface of the cover to prevent leaking of acoustic vibration from, the first space to serve as the front chamber, to the third space located outside the acoustic sensor and the supporting member and surrounded by the cover and the circuit board.

2. The microphone according to claim 1, wherein the supporting member is provided with a wiring structure for electrically connecting the acoustic sensor and the circuit board.

3. The microphone according to claim 1, wherein the acoustic transmission path is formed by recessing a top surface section of the supporting member into concave form or groove form.

4. The microphone according to claim 1, wherein the hollow for accommodating the signal processing circuit vertically penetrates through the supporting member.

5. The microphone according to claim 1, wherein
a sound introduction hole for introducing an acoustic vibration is opened in the cover, and
the acoustic sensor is configured such that the first space to serve as the front chamber is enclosed and brought into intimate contact with an area surrounding the sound introduction hole and adjacent to the inner surface of the cover.

6. The microphone according to claim 1, wherein
the under surface of the supporting member is configured in a concave form to provide the hollow for accommodating the signal processing circuit, and
the hollow and the acoustic transmission path are partitioned by the supporting member.

* * * * *